(12) United States Patent
Wang (10) Patent No.: US 12,285,103 B2
(45) Date of Patent: Apr. 29, 2025

(54) PACKAGE TRAY AND CASE MODULE INCLUDING THE PACKAGE TRAY

(71) Applicant: EmCom Technology Inc., Taipei (TW)

(72) Inventor: Chu-Li Wang, Taipei (TW)

(73) Assignee: EMCOM TECHNOLOGY INC., Taipei (TW)

( * ) Notice: Subject to any disclaimer, the term of this patent is extended or adjusted under 35 U.S.C. 154(b) by 757 days.

(21) Appl. No.: 17/387,259

(22) Filed: Jul. 28, 2021

(65) Prior Publication Data

US 2022/0183462 A1 Jun. 16, 2022

(30) Foreign Application Priority Data

Dec. 10, 2020 (TW) .................................. 109143728

(51) Int. Cl.
*A47B 57/48* (2006.01)
*A47B 96/06* (2006.01)
*H05K 7/14* (2006.01)

(52) U.S. Cl.
CPC .......... *A47B 57/485* (2013.01); *A47B 96/068* (2013.01); *H05K 7/14* (2013.01)

(58) Field of Classification Search
CPC ......... A47B 96/14; A47B 96/068; A47B 7/32; H05K 7/14
USPC ...................................................... 361/810
See application file for complete search history.

(56) References Cited

U.S. PATENT DOCUMENTS

| 5,975,962 | A | 11/1999 | Laukonis |
| 2014/0160716 | A1* | 6/2014 | He .................. H01M 50/244 361/810 |
| 2018/0358824 | A1* | 12/2018 | Roberts .............. G06F 1/1632 |

FOREIGN PATENT DOCUMENTS

| JP | 2012119220 A | 6/2012 |
| TW | M-364447 U1 | 9/2009 |

OTHER PUBLICATIONS

Office Action mailed Sep. 6, 2021 in TW Application No. 109143728, 4 pages.

* cited by examiner

*Primary Examiner* — Anthony D Stashick
*Assistant Examiner* — Raven Collins
(74) *Attorney, Agent, or Firm* — Muncy, Geissler, Olds & Lowe, P.C.

(57) ABSTRACT

The present disclosure provides a package tray and a case module. The package tray includes a first frame and a second frame. The first frame has a first side and a second side. The second frame has a third side and a fourth side connected to the second side. Wherein, the length of the first side is greater than the length of the third side, and a plurality of positioning locations are distributed on both the first frame and the second frame. At least a portion of the positioning locations are disposed corresponding to each other.

14 Claims, 11 Drawing Sheets

PACKAGE TRAY AND CASE MODULE INCLUDING THE PACKAGE TRAY

BACKGROUND OF THE INVENTION

1. Field of the Invention

The present disclosure relates to a package tray and a case module; in specially, the present disclosure relates to a package tray having two carrying surfaces for carrying devices such as instruments and a case module including the package tray.

2. Description of the Prior Art

Many offices or houses have a space similar to computer facilities, wherein a plurality of computer cases or cabinets are disposed for integrating related circuits, sockets, and devices. Traditionally, the package tray for carrying instruments, devices and apparatuses in the case has a single carrying surface; therefore, different types of package trays are required to be disposed in accordance with the conditions of the instruments such as shapes, sizes, and weights.

However, when using a package tray with a single carrying surface, devices are carried by a carrying surface of a fixed size and holes for disposing straps. As a result, layouts of the straps can't be adjusted suitably in accordance with the shapes and sizes of the instruments.

In addition, since it is difficult to use the same package tray to carry devices of various shapes and sizes, package trays of different types or sizes need to be prepared and it is not convenient to do so.

SUMMARY OF THE INVENTION

The present disclosure intends to provide a package tray for carrying objects of different sizes or shapes by changing carrying surfaces and a case module utilizing such package tray.

An embodiment of the present disclosure provides a package tray including a first frame and a second frame. The first frame has a first side and a second side; the second frame has s third side and a fourth side connected to the second side. Wherein, the length of the first side is greater than the length of the third side, and each of the first frame, and a plurality of positioning locations are distributed on both the first frame and the second frame. At least a portion of the positioning locations are disposed corresponding to each other.

An embodiment of the present disclosure provides a case module including a backboard having a plurality of holes, at least one strap, and at least one package tray. The package tray includes a first frame and a second frame. The first frame has a first side and a second side, and the second frame has a third side and a fourth side connected to the second side, wherein, the length of the first side is greater than the length of the third side. A plurality of positioning locations are distributed on both the first frame and the second frame. At least a portion of the positioning locations are disposed corresponding to each other, and at least one strap is configured to pass through at least one of the plurality of positioning locations.

Using the package tray and the case module, one can carry different types of computer devices more conveniently.

DETAILED DESCRIPTION OF THE PREFERRED EMBODIMENT

Figure 1A:
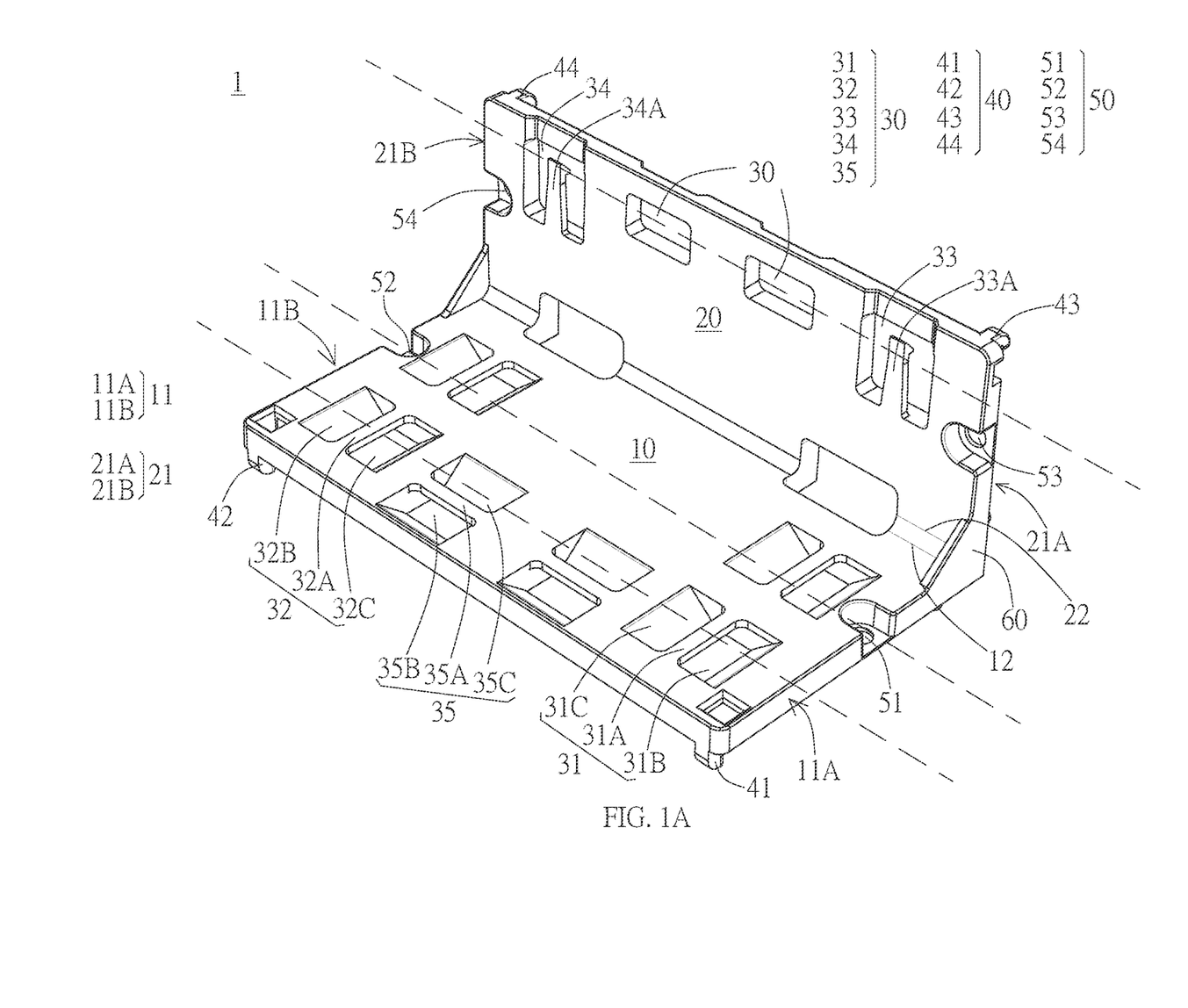
FIG. 1A is a perspective view illustrating an embodiment of the package tray of the present disclosure disposed in the first state.
Figure 1B:
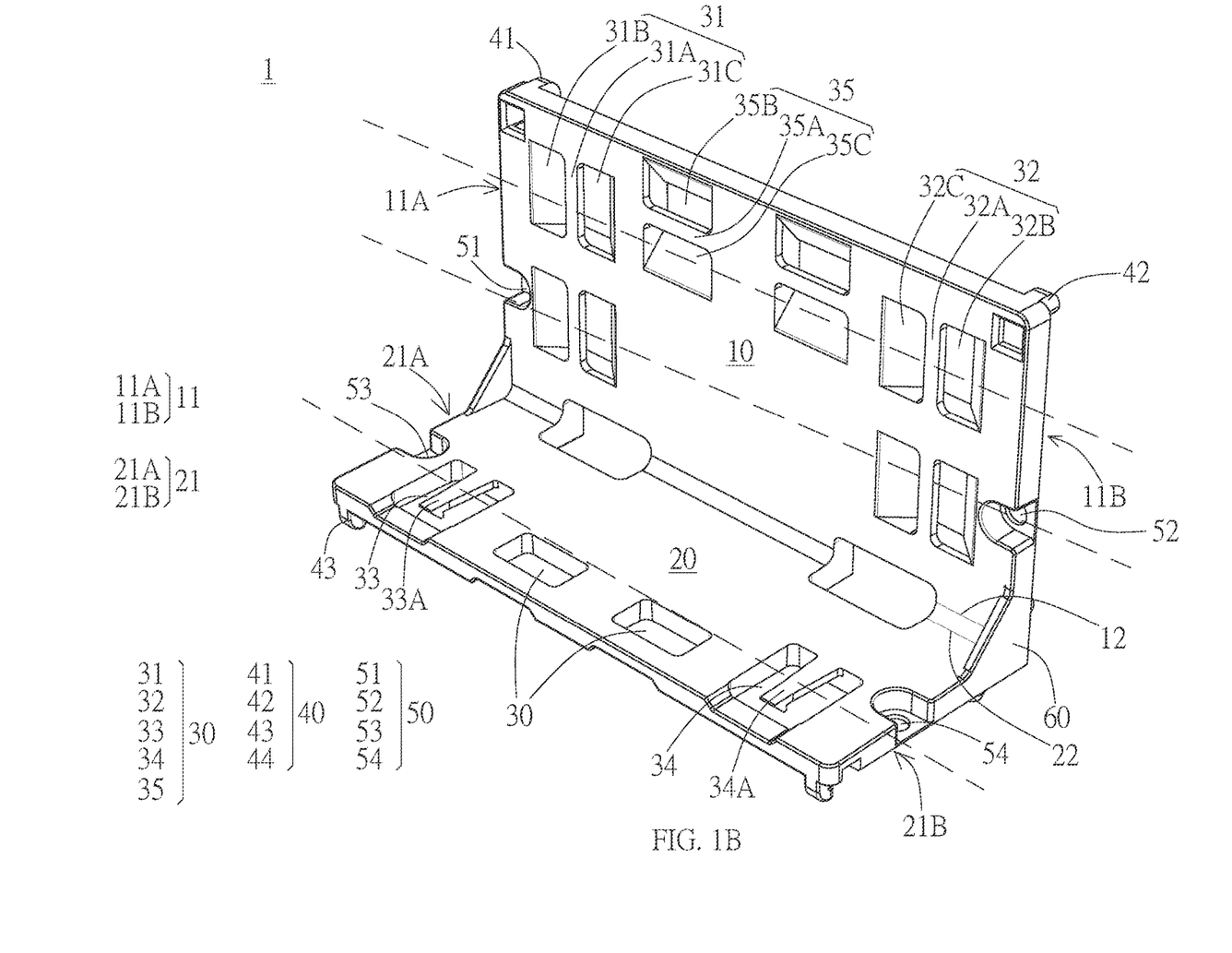
FIG. 1B is a perspective view illustrating an embodiment of the package tray of the present disclosure disposed in the second state.

Please refer to FIG. 1A and FIG. 1B, FIG. 1A and FIG. 1B are perspective views respectively illustrating an embodiment of a package tray 1 of the present disclosure disposed in the first state and the second state. As illustrated in FIG. 1A, the package tray 1 has a first frame 10 and a second frame 20. When the package tray 1 is disposed in the first state, the first frame 10 and the second frame 20 are respectively used as a bottom plate and a side surface. As illustrated in FIG. 1B, when the package tray 1 is disposed in the second state, the first frame 10 and the second frame 20 are respectively used as a side surface and a bottom plate. The first frame 10 has a first side 11 and a second side 12; and the second frame 20 has a third side 21 and a fourth side 22. Specifically, the first side 11 is the opposite two sides of the first frame 10, extending along the extending direction, and the second side 12 is the opposite two sides of the first frame 10, extending along the width direction. Similarly, the third side 21 is the opposite two sides of the second frame 20, extending along the extending direction, and the fourth side 22 is the opposite sides of the second frame 20, extending along the width direction. In the present embodiment, lengths of the second side 12 and the fourth side 22 are respectively greater than lengths of the first side 11 and the third side 21; that is, in the present embodiment, the first frame 10 and the second frame 20 are rectangles in which the lengths along the width directions are greater than the lengths along the extending directions; however, the present disclosure is not limited thereto. Designs can be changed in accordance with the actual case modules and they may also be squares in which lengths along the width directions are equal to the lengths along the extending directions. In addition, the length of the first side 11 is greater than the length of the third side 21, and the second side 12 and the fourth side 22 are connected to each other. That is, the length of the first frame 10 along the extending direction is greater than the length of the second frame 20 along the extending direction; therefore, the area of the carrying portion of the first frame 10 is greater than the area of the carrying portion of the second frame 20. For example, in the present embodiment, the first frame 10 and the second frame 20 are perpendicularly connected at the second side 12 and the fourth side 22 so as to form the L-shaped package tray 1; however, the way to connect the second side 12 and the fourth side 22 in the present disclosure is not limited thereto. As such, the package tray 1 in the present disclosure is not limited to an L-shape. In addition, the package tray 1 in the present disclosure may selectively include a connecting mechanism 60 located between the second side 12 and the fourth side 22 so as to increase connection stability between the first frame 10 and the second frame 20. In the present embodiment, since the first frame 10 and the second frame 20 are perpendicularly connected, the shape of the connecting mechanism 60 is like a right triangle; and of the connecting mechanism 60 extends respectively along the first side 11 and the third side 21. Furthermore, in the present embodiment, the connecting mechanisms 60 are disposed on each of the two ends of the connecting location between the second side 12 and the fourth side 22 (that is, the intersection of the first side 11 and the second side 12 and the intersection of the third side 21 and the fourth side 22). More spaces for disposing carried objects may be created by disposing the connection mechanism 60 on the two ends of the connecting location between the second side 12 and the fourth side 22. However, the location, shape, and number of the connecting mechanism 60 in the present disclosure are not limited thereto. The connecting mechanism 60 may also be disposed at only one end of the connecting location between the second side 12 and the fourth side 22. In addition, the shape of the connecting mechanism 60 may also be a non-triangular shape.

As illustrated in FIG. 1A and FIG. 1B, a plurality of positioning locations are distributed on each of the first frame 10 and the second frame 20, and at least some of the positioning locations 30 are disposed corresponding to each other. The positioning locations 30 may contain holes for straps (straps with buckles) to pass through, pins in the holes or other mechanisms for connection. Specifically, at least one first positioning location 31 and at least one second positioning location 32 are distributed on the first frame 10; at least one third positioning location 33 and at least one fourth positioning location 34 are distributed on the second frame 20. For example, as illustrated in FIG. 1A and FIG. 1B, the first positioning location 31 and the second positioning location 32 may be located on the same straight line extending along the second side 12, and the third positioning location 33 and the fourth positioning location 34 may be located on the same straight line extending along the fourth side 22.

Furthermore, a plurality of the first positioning locations 31 and a plurality of the second positioning locations 32 may be distributed on the first frame 10. As illustrated in FIG. 1A and FIG. 1B, one of the first positioning locations 31 and another of the first positioning locations 31 may be located on the same straight line extending along the first side 11, and one of the second positioning locations 32 and another of the second positioning locations 32 may be located on the same straight line extending along the first side 11. Therefore, the positioning locations 30 may be distributed on the first frame 10 to form an array. For example, the positioning locations 30 may be distributed on the first frame 10 to form an 2×2 array (for example, two first positioning locations 31 and two second positioning locations 32). However, in different embodiments, many more positioning locations may be included in accordance with the length of the first side 11, and the distribution of the positioning locations 30 on the first frame 10 are not limited to arrays. For example, at least one fifth positioning location 35 may be further distributed on the first frame 10.

In an embodiment of the present disclosure, the first positioning location 31 has a member 31A to form a first location 31B and a second location 31C located at two opposite sides with respect to the member 31A, and each of them are used as a hole for straps to pass through. For example, a strap may be disposed so that at least part of the strap extends along the direction crossing the first frame 10 from the first location 31B, at the same time, another part of the strap extends toward the second positioning location 32 along the first frame 10. Similarly, the second positioning location 32 has a member 32A to form a first location 32B and a second location 32C located as two opposite sides with respect to the member 32A. Each of them is used as a hole for straps to pass through and the strap may be disposed so that at least part of it extends along the direction crossing the first frame 10 from the second location 32B and another part of it extends toward the first positioning location 31 along the first frame 10. In the present embodiment, each of the member 31A and the member 32A extends along the first side 11; therefore, it is convenient to fasten straps or similar elements extending along the second side 12. On the contrary, the fifth positioning location 35 has a member 35A extending along the second side 12 to form a first location 35B and a second location 35C located at two opposite sides with respect to the member 35A. Therefore, straps or similar elements may be disposed along the first side 11 in accordance with the actual demands. In addition, one or more of the fifth positioning locations 35 may be selectively disposed in accordance with actual demand. In an embodiment of the present disclosure, the fifth positioning location 35 may be located between the first positioning location 31 and the second positioning location 32; however, the present disclosure is not limited thereto. Moreover, except where some of the positioning locations 30 are distributed corresponding to each other, the types or positions of the positioning locations 30 are not subject to specific restriction.

Please refer to FIG. 1A and FIG. 1B again. As illustrated in FIG. 1A and FIG. 1B, the third positioning location 33 and the fourth positioning location 34 are distributed on the second frame 20; the third positioning location 33 and the fourth positioning location 34 are preferably distributed corresponding to each other. For example, the third positioning location 33 and the fourth positioning location 34 may be located on the same straight line extending along the fourth side 22. The third positioning location 33 and the fourth positioning location 34 may respectively have a first member 33A and a second member 34A extending along the third side 21 so that straps or similar elements can be extended along the fourth side 22 to surround carried devices and the like. In addition, a plurality of the third positioning location 33, a plurality of the fourth positioning location 34 or other types of the positioning locations 30 may be disposed selectively in accordance with the actual length of the third side 21 or the fourth side 22. For example, in an embodiment of the present disclosure, one or more of the positioning locations 30 may be disposed between the third positioning location 33 and the fourth positioning location 34. However, except where some of the positioning locations 30 are distributed corresponding to each other, types or positions of the positioning locations 30 are not specifically limited in the present disclosure.

Figure 1C:
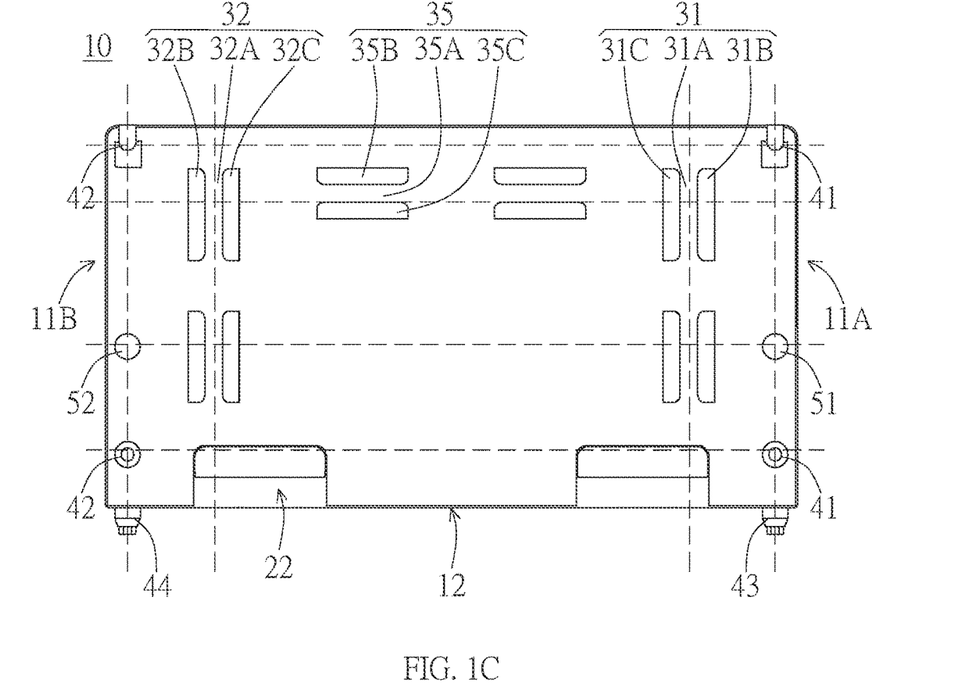
FIG. 1C is a back view illustrating the first frame of an embodiment of the package tray of the present disclosure.
Figure 1D:
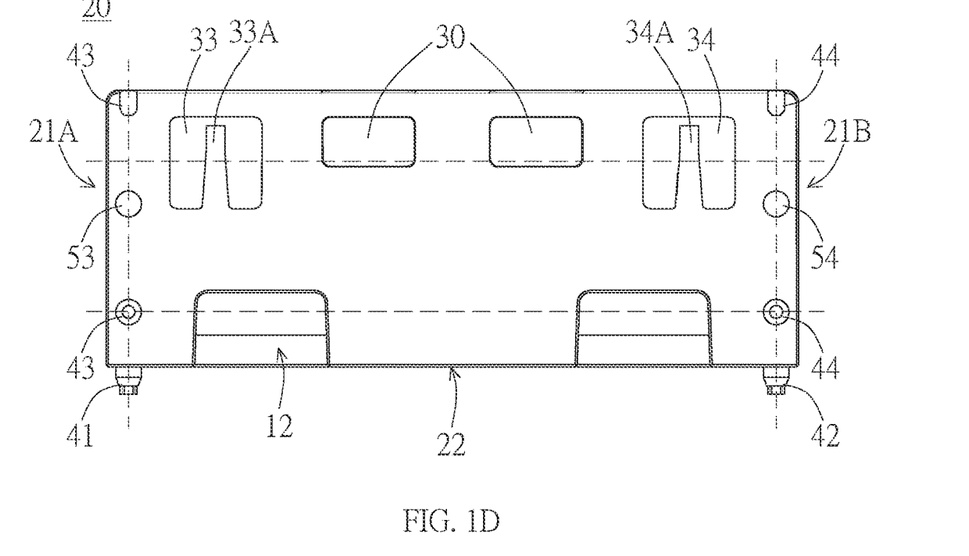
FIG. 1D is a back view of the second frame of an embodiment of the package tray of the present disclosure.

Please refer to FIG. 1C and FIG. 1D. FIG. 1C and FIG. 1D respectively illustrate the back-view of an embodiment of the first frame 10 and the second frame 20 of the package tray 1 in the present disclosure. As illustrated in FIGS. 1A and 1D, in an embodiment of the present disclosure, a plurality of pins 40 are distributed on the backside of at least one of the first frame 10 and the second frame 20. At least one of the first frame 10 and the second frame 20 has at least one screw hole 50 used as a hole for fasteners such as screws passing through. The screw hole 50 is preferably depressed with respect to the first frame 10 and the second frame 20 so that fasteners may pass through the first frame 10 and the second frame 20. For example, as illustrated in FIG. 1C, the plurality of pins 40 may be distributed on the backside of the first frame 10; the first frame 10 may have at least one of screw hole 50. At least one of the plurality of pins 40 and at least one of the screw holes 50 are preferably located on the same straight line along the first side 11; therefore, the first frame 10 may be fastened on the wall more evenly and stably by disposing fasteners corresponding to at least one of the plurality of pins 40 when the package tray 1 is installed in a case in the second state.

Furthermore, the first side 11 contains the first side 11A and the first side 11B opposite to each other. The plurality of pins 40 distributed on the backside of the first frame 10 includes at least one first pin 41 located at the first side 11A and at least one second pin 42 located at the first side 11B. The screw hole 50 on the first frame 10 includes a first screw hole 51 and a second screw hole 52 located at the first side 11A. The first pin 41 and the first screw hole 51 are located on the same straight line extending along the first side 11; the second pin 42 and the second screw hole 52 are located on the same straight line extending along the first side 11. Therefore, the first frame 10 may be fastened on the wall more evenly and stably by disposing fasteners corresponding to the first pin 41 and the second pin 42 (for example, fasteners are disposed at the center point between the first pin 41 and the second pin 42) when the package tray 1 is installed in the second state.

In addition, a plurality of the first pin 41 and a plurality of the second pin 42 may be disposed on the first frame 10 in accordance with the actual demands. As illustrated in FIG. 1C, one of the first pins 41 and one of the second pins 42 are preferably located on the same straight line extending along the second side 12. The first screw hole 51 and the second screw hole 52 are also preferably located on the same straight line extending along the second side 12. Therefore, in an embodiment of the present disclosure, arrangement of the first pin 41, the second pin 42, the first screw hole 51, and the second screw hole 52 may be in the shape of a 3×3 array. Disposing pins 40 and the screw holes 50 corresponding to each other is useful for fastening the first frame 10 to a wall such as the backboard of a case. However, arrangement of the pins 40 and the screw holes 50 in the present disclosure is not limited thereto. The arrangement may be adjusted suitably in accordance with the walls on which the package tray 1 is installed. In addition, the way to fasten the first frame 10 to the wall is not limited to using pins 40 and the screw holes 50.

Similarly, as illustrated in FIG. 1D, the plurality of pins 40 can be distributed on the backside of the second frame 20. The second frame 20 may also have at least one screw hole 50. At least one of the plurality of pins 40 and at least one of the screw holes 50 are preferably located on the same straight line extending along the third side 21; therefore, the second frame 20 may be fastened on the wall more stably by disposing fasteners corresponding to at least one of the plurality of pins 40 when the package tray 1 is installed on the wall in the first state.

Furthermore, the third side 21 includes a third side 21A and a third side 21B opposite to each other. A plurality of pins 40 distributed on the back side of the second frame 20 include at least one third pin 43 located at the third side 21A and at least one fourth pin 44 located at the third side 21B. The screw hole 50 on the second frame 20 includes a third screw hole 53 located on the third side 21A and a fourth screw hole 54 located on the third side 21B. The third pin 43 and the third screw hole 53 are located on the same straight line extending along the third side 21. The fourth pin 44 and the fourth screw hole 54 are located on the same straight line along the third side 21. Therefore, the second frame 20 may be fastened to the wall more stably by disposing fasteners corresponding to the third pin 43 and the fourth pin 44 (for example, the fasteners are disposed at the center point between the third pin 43 and the fourth pin 44) when the package tray 1 is installed in the wall as the first state.

In addition, a plurality of the third pin 43 and a plurality of the fourth pin 44 may be disposed on the second frame 20 in accordance with actual demands. As illustrated in FIG. 1D, one of the third pins 43 and one of the fourth pins 44 are preferably located on the same straight line extending along the fourth side 22. The third screw hole 53 and the fourth screw hole 54 are also preferably located on the same straight line extending along the fourth side 22. Therefore, in an embodiment of the present disclosure, arrangement of the third pin 43, the fourth pin 44, the third screw hole 53 and the fourth screw hole 54 may be in the shape of a 3×3 array. Disposing the pins 40 and the screw holes 50 corresponding to each other is useful for fastening the second frame 20 to the wall such as the backboard of the case. However, arrangement of the pins 40 and the screw holes 50 in the present disclosure are not limited thereto; the arrangement may be adjusted suitably in accordance with the design of the wall on which the package tray 1 is installed. In addition, the way of fastening the second frame 20 to the wall is not limited to using the pins 40 and the screw holes 50.

Figure 2A:
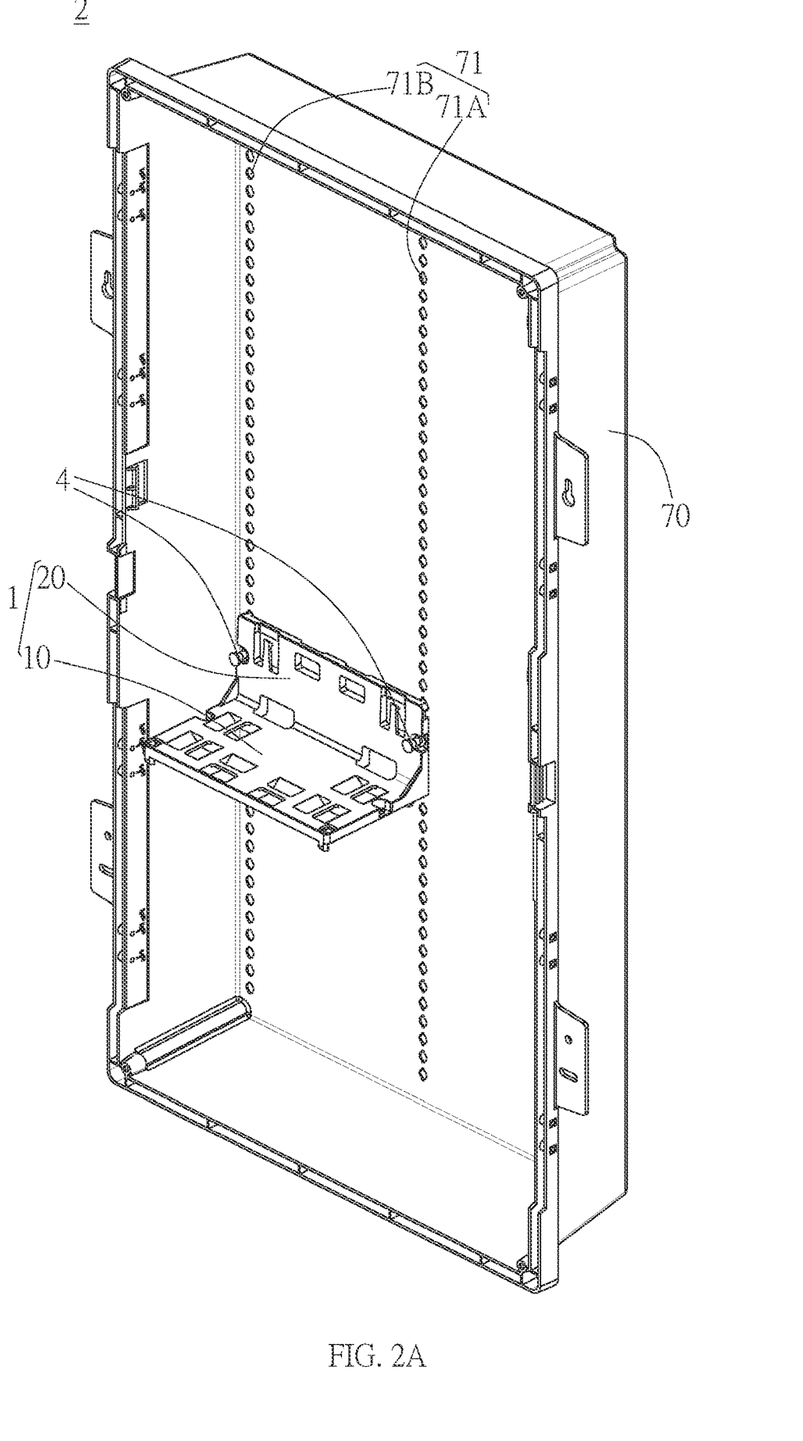
FIG. 2A is a perspective view illustrating an embodiment of a case module of the present disclosure before installing the device.
Figure 2B:
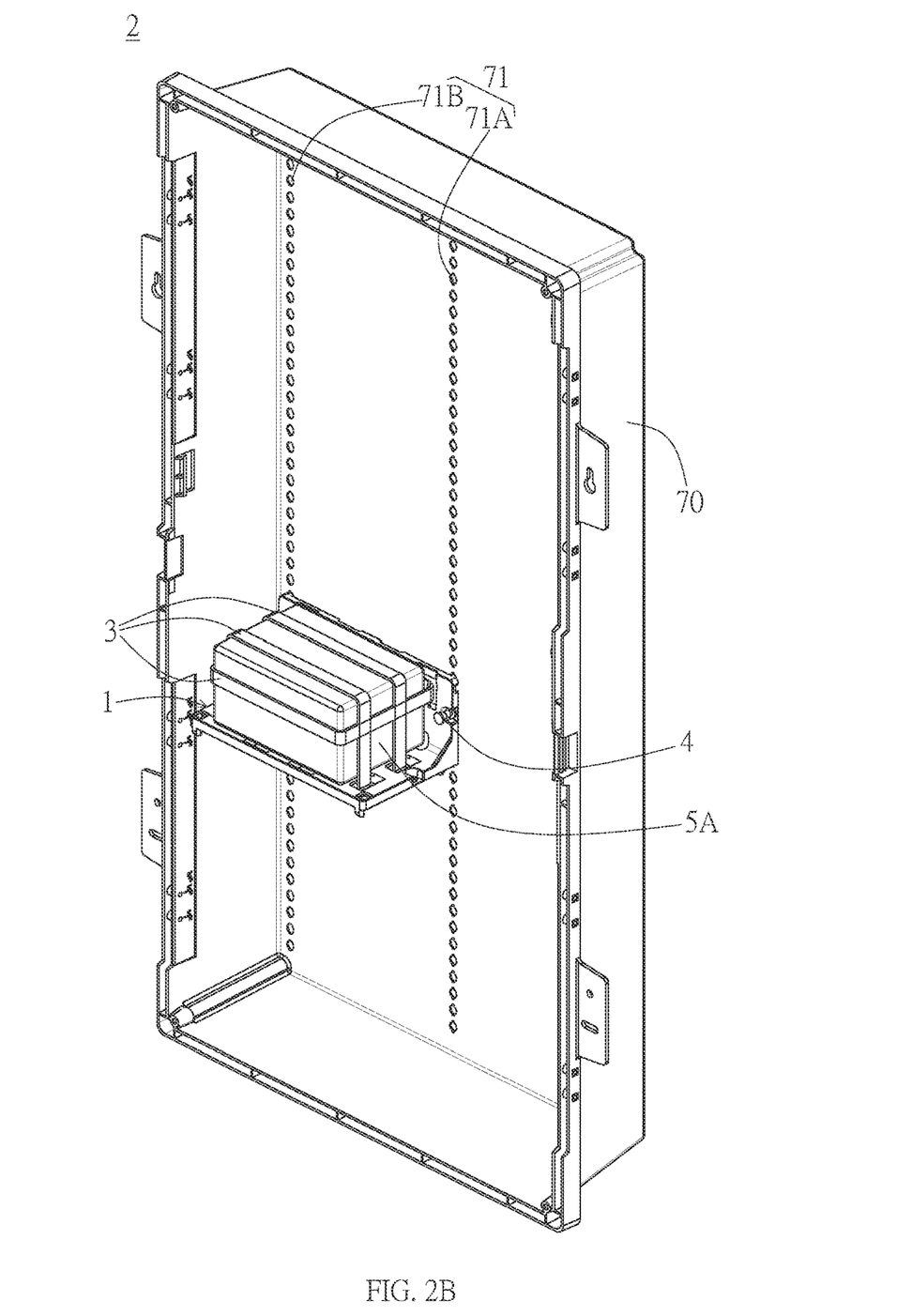
FIG. 2B is a perspective view illustrating an embodiment of a case module of the present disclosure after installing the device.
Figure 2C:
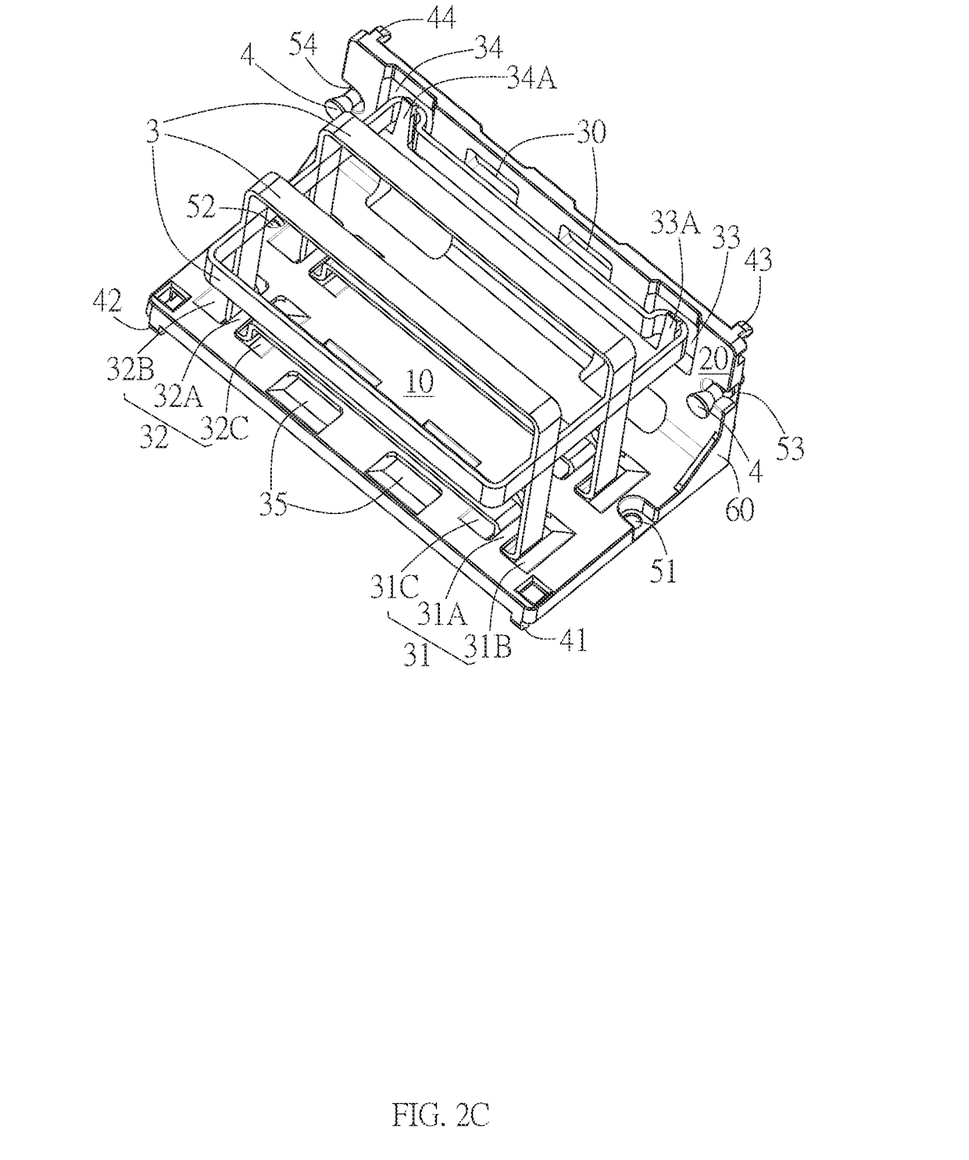
FIG. 2C is a perspective view illustrating the package tray 1 and the strap 3 in the embodiment illustrated in FIGS. 2A and 2B.

Please refer to FIG. 2A, FIG. 2B, and FIG. 2C, FIG. 2A and FIG. 2B respectively illustrates the perspective views of an embodiment of a case module 2 in the present disclosure before and after installing devices. FIG. 2C illustrates the perspective view of the package tray 1 and a strap 3 in the embodiment illustrated in FIG. 2A and FIG. 2B. The case module 2 includes a backboard 70, the package tray 1 and at least one strap 3. The configuration of the package tray 1 may be the same as the aforementioned embodiment (as illustrated in FIG. 1A to FIG. 1D), therefore, the detailed configuration is omitted here. The backboard 70 includes a plurality of holes 71. For example, the plurality of holes 71 may be distributed as a straight line along the height direction of the backboard 70. Specifically, the plurality of holes 71 may further include a plurality of first holes 71A and a plurality of second holes 71B arranged parallel to each other. In the present embodiment, the package tray 1 is installed in the case module 2 in the first state. Therefore, the first frame 10 is used as a bottom plate carrying the devices, and each of the plurality of pins 40 on the second frame 20 is disposed in alignment with one of the plurality of holes 71 so as to fit into the corresponding one of the plurality of holes 71. The strap 3 is configured to pass through at least one of the positioning locations 30 on the package tray 1.

Specifically, in the present embodiment, as illustrated in FIG. 2C, one of the straps 3 may pass through the third positioning location 33 and the fourth positioning location 34 on the second frame 20. When the strap 3 passes through the third positioning location 33 and the fourth positioning location 34, the strap 3 may be hooked on the first member 33A and the second member 34A respectively. Thus, one of the straps 3 at least partially extends along the second frame 20 to surround and fasten a first device 5A. In addition, another strap 3 may be included and configured to at least partially pass through the second location 31C from the first location 31B of the first positioning location 31; and another part of the strap 3 may pass through the second location 32C from the first location 32B of the second positioning location 32. Therefore, at least a part of the strap 3 is hooked on the member 31A of the first positioning location 31 and the member 32A of the second positioning location 32. In addition, a plurality of the strap 3 may be disposed in accordance with the number of the positioning locations 30.

For example, as illustrated in FIG. 2C, when the package tray 1 includes two first positioning locations 31, two second positioning locations 32, a third positioning location 33 and a fourth positioning location 34, three straps 3 are used in the package tray 1 to surround and fasten the first device 5A carried by the first frame 10. The first device 5A, for example, may be a rectangular machine device; however, numbers and arrangements of the strap 3 used in the present disclosure is not limited thereto, and the first device 5A is not limited to a rectangular device. Therefore, another positioning location 30 such as the fifth positioning location 35 may also be used or only one strap 3 may be disposed. In addition, the strap 3, for example, may be a strap with adhesiveness such as a Velcro fastener in accordance with the shape and the size of the first device 5A. However, types of the strap 3 in the present disclosure is not limited thereto.

In the present embodiment, each of the plurality of pins 40 on the second frame 20 are disposed aligned in alignment one of the plurality of holes 71 to fit into the corresponding one of the plurality of holes 71. For example, each of the third pin 43 and the fourth pin 44 may be disposed in alignment with one of the plurality of first holes 71A and the plurality of second holes 71B to fit into the corresponding one of the plurality of first holes 71A and the plurality of second holes 71B.

In an embodiment of the present disclosure, the case module 2 may further include at least one fastener 4. The fastener 4 is configured to pass through the screw hole 50 on the second frame 20 to fit into the corresponding one of the plurality of holes 71. Therefore, the package tray 1 is preferably configured that the screw hole 50 is aligned with one of the plurality of holes 71 so that the fastening strength of the package tray 1 in the case module 2 is further increased by the fastener 4. Specifically, in the present embodiment, each of the third screw hole 53 and the fourth screw hole 54 is disposed corresponding to (that is, aligned with) one of the plurality of first holes 71A and the plurality of second holes 71B. Therefore, each of the fastener 4 passing through the third screw hole 53 or the fourth screw hole 54 fits into the first hole 71A or the second hole 71B corresponding to the third screw hole 53 or the fourth screw hole 54 so that the second frame 20 is fastened on the backboard 70. In the present embodiment, the fastener 4 is a screw such as a plastic rivet; however, the present disclosure is not limited thereto. In addition, as mentioned above, at least some of the pins 40 (the third pin 43 and the fourth pin 44) on the second frame 20 and the screw hole 50 are preferably disposed corresponding to each other (For example, please refer to the embodiment illustrated in FIG. 1C and FIG. 1D) so that the package tray 1 can keep its balance in the case module 2.

Figure 3A:
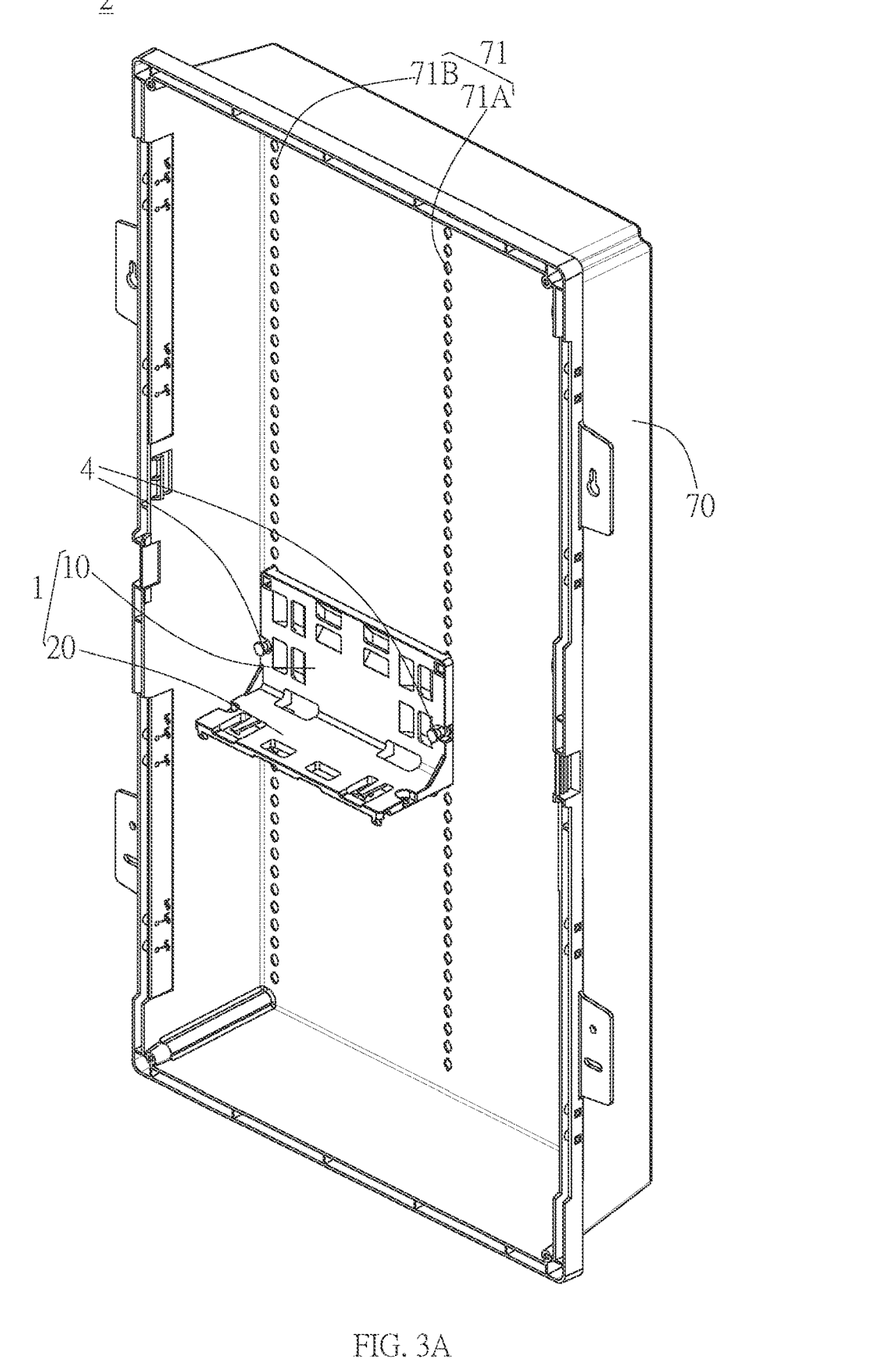
FIG. 3A is a perspective view illustrating another embodiment of a case module of the present disclosure before installing the device.
Figure 3B:
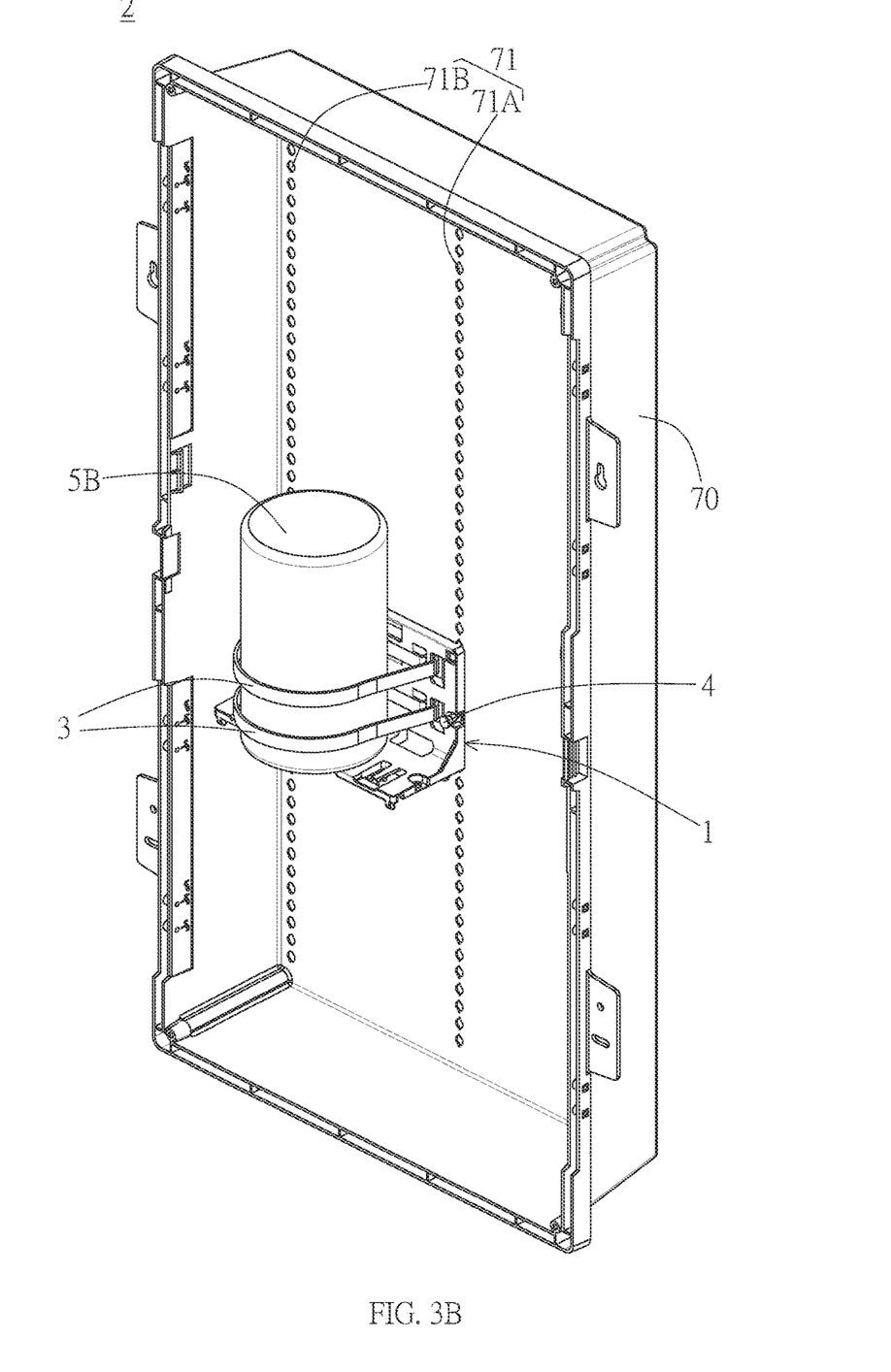
FIG. 3B is a perspective view illustrating another embodiment of a case module of the present disclosure after installing the device.
Figure 3C:
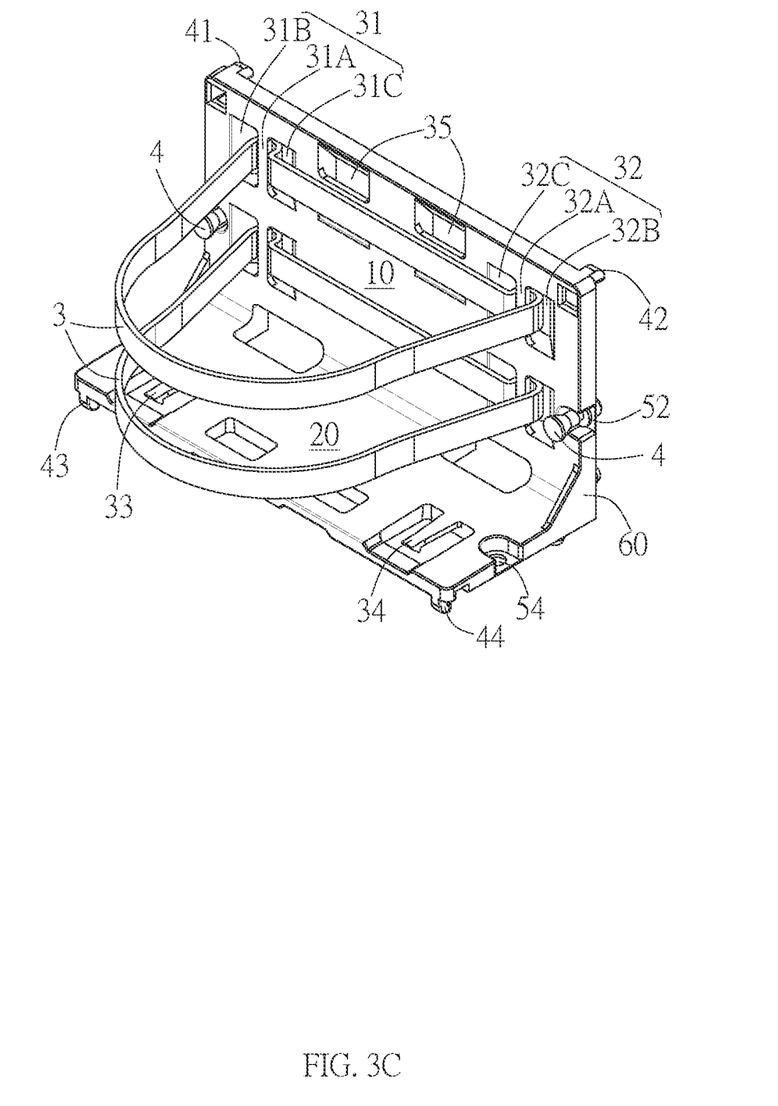
FIG. 3C is a perspective view illustrating the package tray 1 and the strap 3 in the embodiment illustrated in FIGS. 3A and 3B.

FIG. 3A and FIG. 3B respectively illustrate perspective views of another embodiment of the case module 2 in the present disclosure before and after installing the device, and FIG. 3C illustrates a perspective view of the package tray 1 and the strap 3 in the embodiment illustrated in FIG. 3A and FIG. 3B. The differences between the present embodiment and the embodiment illustrated in FIGS. 2A to 2C are that the package tray 1 is installed on the backboard 70 of the case module 2 in the second state in and the strap 3 is disposed in a different way from the aforementioned embodiment.

Specifically, as illustrated in FIG. 3C, the strap 3 may be configured to at least partially pass through the second location 31C from the first location 31B of the first positioning location 31. In addition, another part of the same strap 3 may pass through the second location 32C from the first location 32B of the second positioning location 32. Therefore, at least a part of the strap 3 is hooked on the member 31A of the first positioning location 31 and the member 32A of the second positioning location 32. In addition, a plurality of the strap 3 may be disposed in accordance with the number of the positioning locations 30.

For example, as illustrated in FIG. 3C, when the package tray 1 includes two first positioning locations 31 and two second positioning locations 32, two straps 3 are used in the package tray 1 to surround the second device carried by the first frame 10. The second device 5B, for example, may be a long cylindrical machine device; however, the second device 5B is not limited to a long cylindrical machine device; in addition, the strap 3 may be configured not to pass through the third positioning location 33 and the fourth positioning location 34 or another strap 3 may be configured to pass through the fifth positioning location 35 may also be disposed in accordance with the height of the second device 5B. The number and arrangement of the strap 3 in the present disclosure are not limited thereto; and the strap 3, for example, may be a strap with Velcro. However, types of the strap 3 in the present disclosure are not limited thereto.

In addition, in the present embodiment, each of the plurality of pins 40 on the first frame 10 is disposed in alignment with one of the plurality of holes 71 to fit into one of the plurality of holes 71. For example, each of the first pin 41 and the second pin 42 may be disposed in alignment with one of the plurality of first holes 71A and the plurality of second holes 71B to fit into the corresponding one of the plurality of first holes 71A and the plurality of second holes 71B.

In the present embodiment, the fastener 4 is configured to pass through the screw hole 50 on the first frame 10 to fit into the corresponding one of the plurality of holes 71. Therefore, the package tray 1 is preferably configured that the screw hole 50 is aligned with one of the plurality of holes 71 so that the fastening strength of the package tray 1 in the case module 2 is further increased by the fastener 4. For example, each of the first screw hole 51 and the second screw hole 52 are disposed corresponding to (that is, aligned with) one of the plurality of first holes 71A and the plurality of second holes 71B so that the plurality of fasteners 4 passing through the first screw hole 51 or the second screw hole 52 fit into the first hole 71A or the second hole 71B corresponding to the first screw hole 51 or the second screw hole 52. Therefore, the first frame 10 may be fastened on the backboard 70 more stably. In addition, at least one of the pins 40 (the first pin 41 and the second pin 42) on the first frame 10 and the screw hole 50 are preferably disposed corresponding to each other (for example, please refer to the embodiment illustrated in FIG. 1C and FIG. 1D) so that the package tray 1 can keep its balance in the case module 2.

Figure 4A:
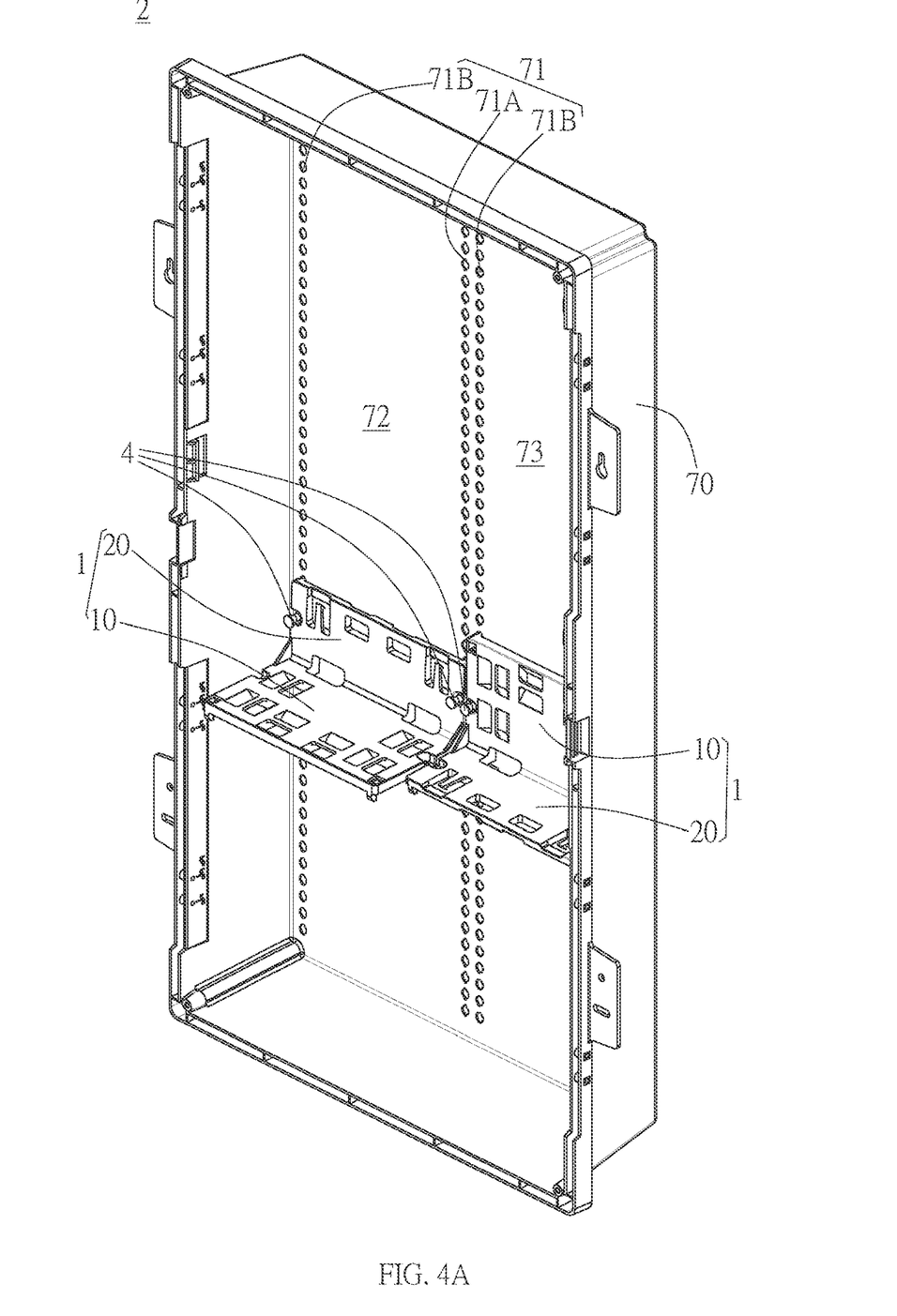
FIG. 4A is a perspective view illustrating a varied embodiment of a case module of the present disclosure before installing the device.
Figure 4B:
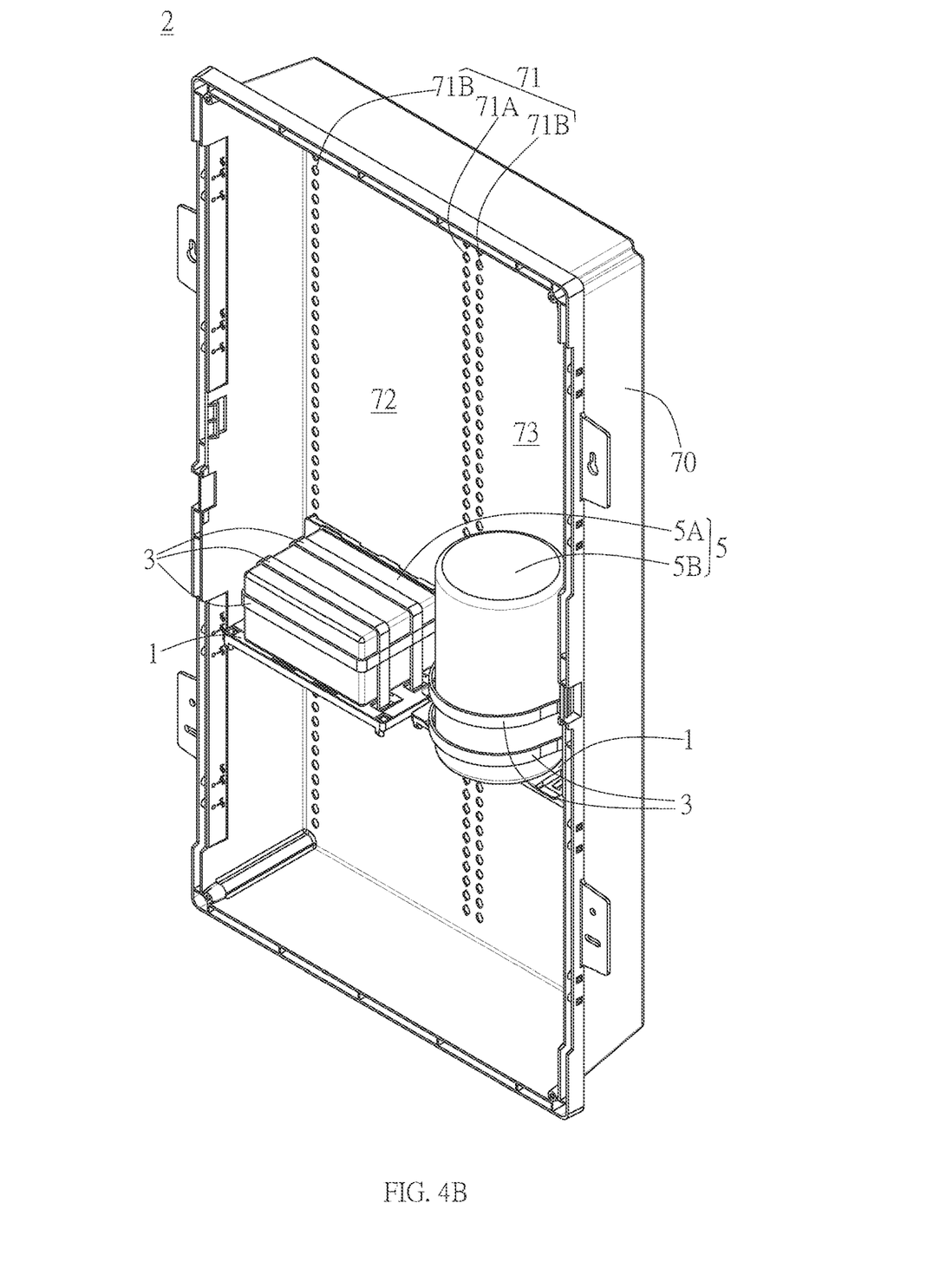
FIG. 4B is a perspective view illustrating a varied embodiment of a case module of the present disclosure after installing the device.

Please refer to FIG. 4A and FIG. 4B, FIG. 4A and FIG. 4B respectively illustrate a perspective view of a varied embodiment of the case module 2 in the present disclosure before and after installing the devices. In the varied embodiment, the backboard 70 may include a first area 72 and a second area 73. Each of the first area 72 and the second area 73 includes a plurality of first holes 71A and a plurality of second holes 71B. In addition, the package trays 1 may be disposed in each of the first area 72 and the second area 73 (therefore, in the present embodiment, the case module 2 may include a plurality of the package trays 1). For example, in the first area 72, the package tray 1 may be configured that the second frame 20 is aligned with the backboard 70 (that is, the first state); and in the second area 73, the package tray 1 may be configured that the first frame 10 is aligned with the backboard 70 (that is, the second state).

Specifically, in the first area 72, each of the plurality of pins 40 on the second frame 20 is disposed in alignment with one of the plurality of holes 71 to fit into the corresponding one of the plurality of holes 71. For example, each of the third pin 43 and the fourth pin 44 may be disposed in alignment with one of the plurality of first holes 71A and the plurality of second holes 71B to fit into the corresponding one of the plurality of first holes 71A and the plurality of second holes 71B.

Similarly, in the second area 73, each of the plurality of pins 40 on the first frame 10 is disposed in alignment with the plurality of holes 71 to fit into the corresponding one of the plurality of holes 71. For example, each of the first pin 41 and the second pin 42 may be disposed in alignment with one of the plurality of first holes 71A and the plurality of second holes 71B so as to fit into the corresponding one of the plurality of first holes 71A and the plurality of second holes 71B.

In an embodiment of the present disclosure, the case module 2 may further include at least one fastener 4. The fastener 4 is configured to pass through a screw hole 50 on either the first frame 10 or the second frame 20 which is aligned with the backboard 70 to fit into the corresponding one of the plurality of holes 71. Therefore, the package tray 1 is preferably configured that the screw hole 50 is aligned with one of the plurality of holes 71 so that the fastening strength of the package tray 1 in the case module 2 may be further increased by the fastener 4. In the present embodiment, the fastener 4 is preferably a screw such as a plastic rivet; however, the present disclosure is not limited thereto.

Specifically, in the first area 72, each of the third screw hole 53 and the fourth screw hole 54 is disposed corresponding to (that is, aligned with) one of the plurality of first holes 71A and the plurality of second holes 71B. In the second area 73, each of the first screw hole 51 and the second screw hole 52 is disposed corresponding to (aligned with) one of the plurality of first holes 71A and the plurality of second holes 71B. As mentioned above, at least some of the pins 40 on the first frame 10 and the second frame 20 and the screw holes 50 are disposed corresponding to each other (for example, please refer to the embodiment illustrated in FIG. 1C and FIG. 1D) so that the package tray 1 can keep its balance in the case module 2.

As illustrated in FIG. 4B, the devices 5 with different shapes and different sizes (the first device 5A and the second device 5B) may be disposed on the package trays 1 in each of the first area 72 and the second area 73. For example, the rectangular first device 5A is disposed on the first frame 10 in the first area 72, and the long cylindrical second device 5B is disposed on the second frame 20 in the second area 73. In addition, the strap 3 may be used to surround and fasten the first device 5A and the second device 5B. In other words, whether to the first frame 10 or the second frame 20 to carry the device 5 may be determined by the shape and the size of the device 5. However, the devices 5 disposed on the package trays 1 are not limited thereto. The devices 5 with different shapes and sizes may also be disposed.

The inner configuration of the case module 2 is not limited to the aforementioned embodiments. For example, the case module 2 may not separate into the first area 72 and the second area 73, or it may be separated into more areas. Also, in the present embodiment, the first area 72 and the second area 73 may be exchanged (that is, the package tray 1 may be disposed on the first area 72 in the second state or disposed on the second area 73 in the first state) in the present embodiment. In addition, the first area 72 and the second area 73 may include, at the same time, the package tray 1 with the second frame 20 aligned with the backboard 70 (the first state) and the package tray 1 with the first frame 10 aligned with the backboard 70 (the second state). In addition, the first area 72 and the second area 73 may also include none of the package tray 1.

The aforementioned description merely represents the preferred embodiment of the present disclosure, without any intention to limit the scope of the present disclosure. Various equivalent alternation based on the specification and FIGs are consequently viewed as being embraced by the scope of the present disclosure.

What is claimed is:

1. A package tray, comprising:
    a first frame having a first side and a second side; and
    a second frame having a third side and a fourth side connected to the second side,
    wherein a length of the first side is greater than a length of the third side,
    wherein a plurality of positioning locations distributed on each of the first frame and the second frame, and
    wherein at least some of the positioning locations are disposed corresponding to each other;
    wherein the plurality of positioning locations distributed on the first frame include at least one first positioning location and at least one second positioning location, each of the first positioning location and the second positioning location has a member, and each of the first positioning location and the second positioning location has a first location and a second location at two opposite sides with respect to the member, wherein an extending direction of the members is the same as an extending direction of the first side, wherein the plurality of positioning locations distributed on the first frame further include at least one fifth positioning location, and
    wherein the fifth positioning location has a member extending along the second side, and the fifth positioning location has a first location and a second location located at opposite sides with respect to the member of the fifth positioning location.

2. The package tray according to claim 1, wherein a plurality of pins are distributed on a back side of at least one of the first frame and the second frame.

3. The package tray according to claim 1, wherein at least one of the first frame and the second frame has at least one screw hole.

4. The package tray according to claim 1, wherein the plurality of the positioning locations distributed on the second frame include a third positioning location and a fourth positioning location, and each of the third positioning location and the fourth positioning location has a first hook and a second hook along the third side.

5. The package tray according to claim 1, wherein a plurality of pins are distributed on a back side of the first frame, and the first frame has at least one screw hole, and
wherein at least one of the plurality of pins and the at least one screw hole are located on a same straight line extending along the first side.

6. The package tray according to claim 5, wherein the first side includes two ends opposite to each other,
wherein the plurality of pins include at least one first pin located at one of the two ends and at least one second pin located at the other of the two ends,
wherein the at least one screw hole includes a first screw hole located at the one of the two ends and a second screw hole located at the other of the two ends,
wherein the at least one first pin and the first screw hole are located at a same straight line extending along the first side, and
wherein the at least one second pin and the second screw hole are located at a same straight line extending along the first side.

7. The package tray according to claim 6, wherein one of the at least one first pin and one of the at least one second pin are located at a same straight line extending along the second side, and
wherein the first screw hole and the second screw hole are located at a same straight line extending along the second side.

8. The package tray according to claim 1, wherein the first positioning location and the second positioning location are located at a same straight line extending along the second side.

9. The package tray according to claim 8, further comprising a plurality of the first positioning locations and a plurality of the second positioning locations,
wherein one of the of first positioning locations and another of the first positioning locations are located at a same straight line extending along the first side, and
wherein one of the of second positioning locations and another of the second positioning locations are located at a same straight line extending along the first side.

10. The package tray according to claim 4, wherein the third positioning location and the fourth positioning location are located at a same straight line extending along the fourth side.

11. The package tray according to claim 1, wherein the second frame has a plurality of pins distributed on a back side thereof and at least one screw hole, and
wherein at least one of the plurality of pins and the at least one screw hole are located at a same straight line extending along the third side.

12. The package tray according to claim 11, wherein the third side includes two ends opposite to each other,
wherein the plurality of pins include at least one third pin located at one of the two ends and at least one fourth pin located at the other of the two ends,
wherein the at least one screw hole includes a third screw hole located at the one of the two ends and a fourth screw hole located at the other of the two ends,
wherein the at least one third pin and the third screw hole are located at a same straight line extending along the third side, and
wherein the at least one fourth pin and the fourth screw hole are located at a same straight line extending along the third side.

13. The package tray according to claim 12, wherein one of the at least one third pin and one of the at least fourth pin are located at a same straight line extending along the fourth side, and
wherein the third screw hole and the fourth screw hole are located at a same straight line extending along the fourth side.

14. The package tray according to claim 1, further comprising at least one connecting mechanism located between the second side and the fourth side.

* * * * *